United States Patent [19]

Ragard

[11] Patent Number: 4,705,311

[45] Date of Patent: Nov. 10, 1987

[54] COMPONENT PICK AND PLACE SPINDLE ASSEMBLY WITH COMPACT INTERNAL LINEAR AND ROTARY DISPLACEMENT MOTORS AND INTERCHANGEABLE TOOL ASSEMBLIES

[75] Inventor: Phillip A. Ragard, Binghamton, N.Y.

[73] Assignee: Universal Instruments Corporation, Binghamton, N.Y.

[21] Appl. No.: 833,254

[22] Filed: Feb. 27, 1986

[51] Int. Cl.⁴ .................. B65G 47/91; H05K 13/02
[52] U.S. Cl. .................................. 294/2; 29/740; 29/743; 29/759; 294/64.1; 294/88; 414/752
[58] Field of Search .................. 294/2, 64.1, 88, 115, 294/116; 29/739, 740, 743, 758; 414/226, 737, 744 B, 752; 901/40

[56] References Cited

U.S. PATENT DOCUMENTS

| | | | |
|---|---|---|---|
| 4,151,945 | 5/1979 | Ragard et al. | 29/740 X |
| 4,231,153 | 11/1980 | Browne | 29/739 |
| 4,346,514 | 8/1982 | Makizawa et al. | 29/740 |
| 4,515,507 | 5/1985 | Asai et al. | 294/64.1 X |
| 4,599,037 | 7/1986 | Ross et al. | 294/64.1 X |
| 4,611,397 | 9/1986 | Janisiewicz et al. | 29/740 X |
| 4,624,050 | 11/1986 | Hawkswell | 294/2 X |

Primary Examiner—Johnny D. Cherry
Attorney, Agent, or Firm—Franklin D. Wolffe; Morris Fidelman

[57] ABSTRACT

A compact spindle assembly for surface mounting and insertion of electrical components comprises a unitary casing in which electric rotary and linear displacement motors are housed in order to provide for actuation of a vacuum nozzle and easily interchangeable tool assemblies such that components may be picked from a supply, squared and/or centered during transfer to a placement station, and placed at a particular position on a circuit board or the like.

15 Claims, 12 Drawing Figures

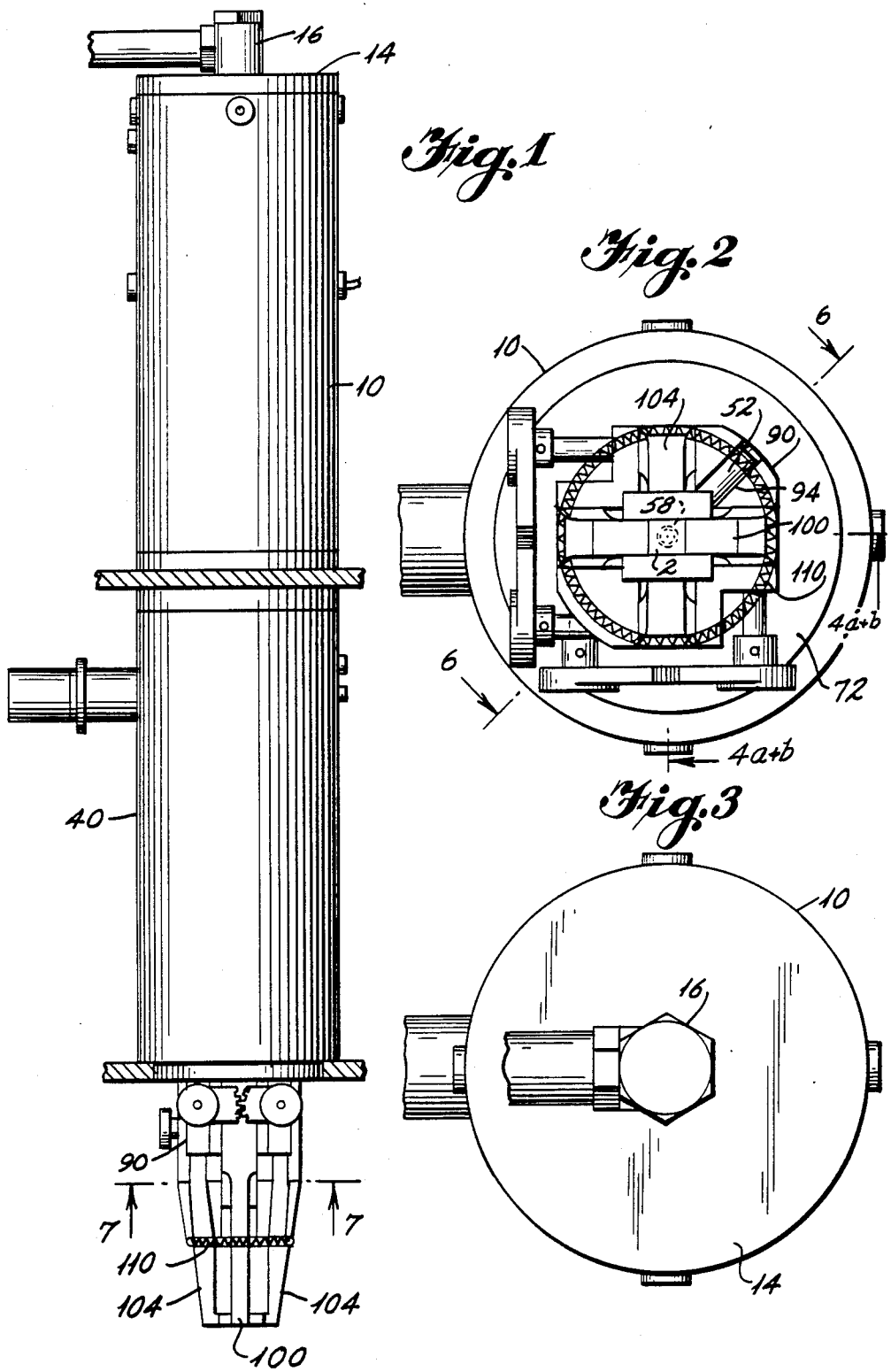

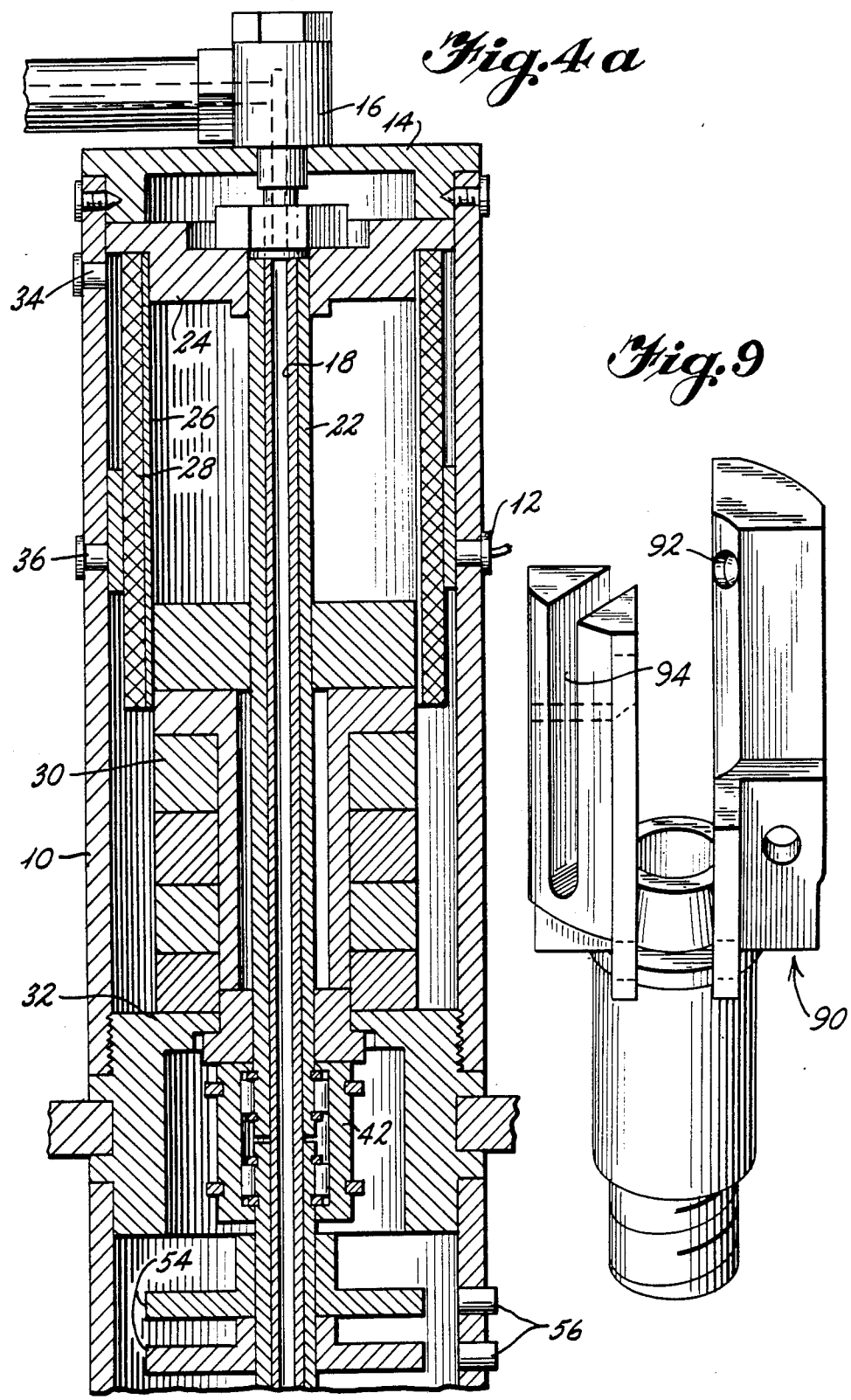

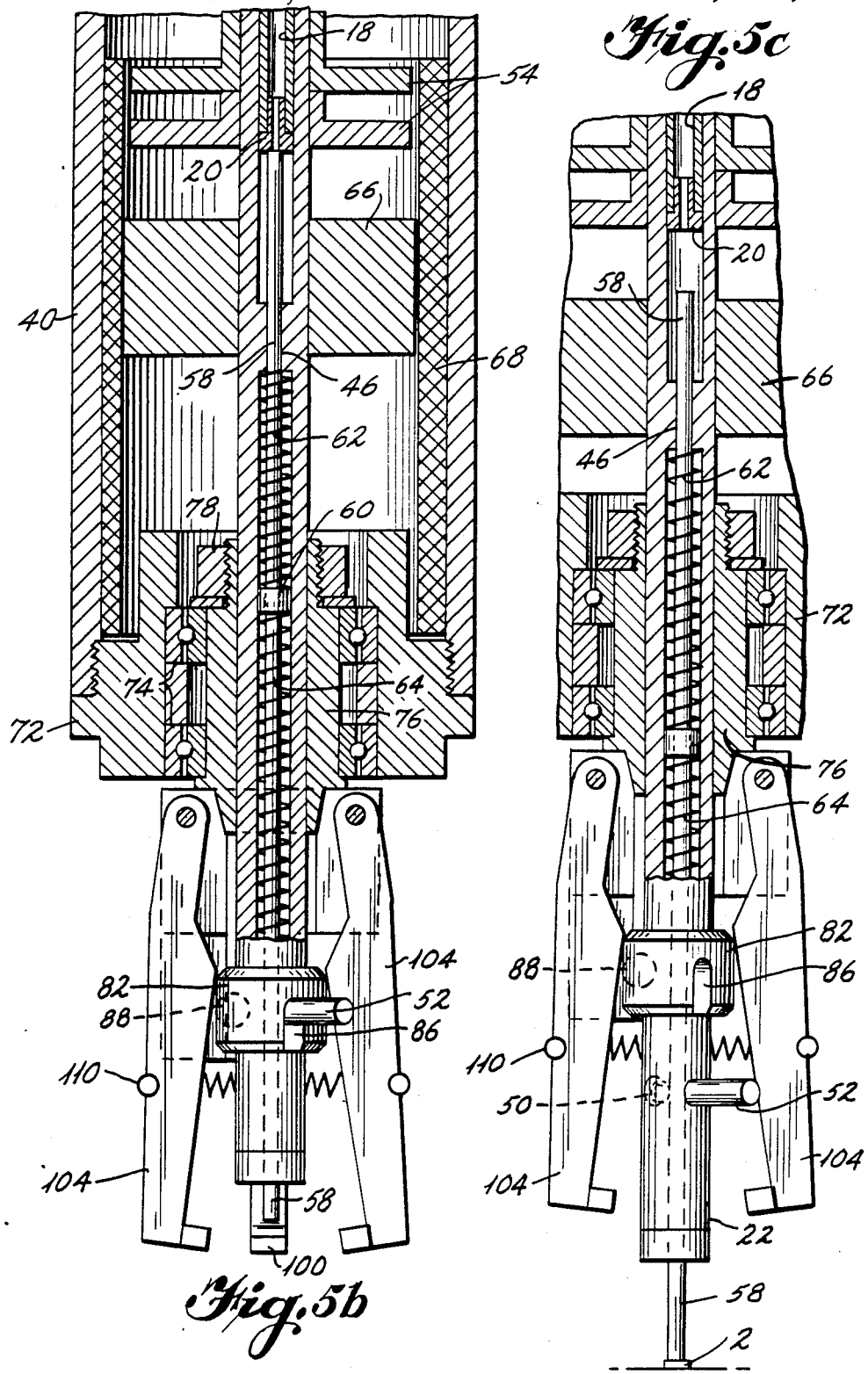

COMPONENT PICK AND PLACE SPINDLE ASSEMBLY WITH COMPACT INTERNAL LINEAR AND ROTARY DISPLACEMENT MOTORS AND INTERCHANGEABLE TOOL ASSEMBLIES

PRIOR ART CROSS—REFERENCES

U.S. Pat. No. 4,372,802—APPARATUS FOR MOUNTING CHIP TYPE CIRCUIT ELEMENTS ON PRINTED CIRCUIT BOARDS —Harigane, et al., issued Feb. 8, 1983.

U.S. Pat. No. 4,151,945—AUTOMATED HYBRID CIRCUIT BOARD ASSEMBLY APPARATUS—Ragard, et al., issued May 1, 1979.

BACKGROUND AND SUMMARY OF THE INVENTION

The invention is directed to a spindle assembly for handling insertion or onsertion of electrical components, wherein the spindle assembly is particularly suited for use with robotic arms and transfer assemblies, one of which is disclosed in the above referenced U.S. Pat. No. 4,151,945——Ragard, et al.

The prior art typically has not provided an integrated spindle assembly for accomplishing these functions wherein the spindle assemblies are interchangeable as a unit. The prior art has not provided such spindle assemblies in a unitary casing containing separate linear and rotary drive motors for displacement of a vacuum tube in concert with operation of gripping and squaring and/or centering fingers of a tool assembly. Such deficiencies in the prior art are overcome by the instant invention, and additional advantages are incorporated in the apparatus of the instant invention, such as easily interchangeable tool assemblies, to handle different size components or perform different functions.

Accordingly, it is an object of the invention to provide such a compact spindle assembly with integral, internal linear and rotary drive motors and an easily interchangeable tool assembly.

These and other objects of the invention will become more apparent from the detailed description of the invention.

In a preferred embodiment of the invention, a compact spindle assembly for surface mounting and insertion of electrical components comprises a unitary casing within which rotational and linear electrical motors are housed to provide for actuation of a vacuum nozzle and an easily interchangeable tool assembly so that components may be picked from a supply, squared and/or centered during transfer to a placement station, and placed at a particular position on a circuit board or the like.

BRIEF DESCRIPTION OF THE DRAWINGS

FIG. 1 is an elevational view of an individual spindle unit.

FIGS. 2 and 3 are respective end views of the device of FIG. 1.

FIGS. 4A and 4B are cross-sectional views through the device of FIG. 1, with one finger of each set of fingers aligned as generally indicated by the arrows in FIG. 2.

FIGS. 5A and 5B are cross-sectional views similar to FIGS. 4A and 4B, but with the fingers opened and the drive tube partially extended.

FIG. 5C is a cross-section illustrating full extension of the drive tube and vacuum tube.

FIG. 9 is an isometric view of the support bracket for the centering fingers.

DETAILED DESCRIPTION OF THE INVENTION

Figure 4B:
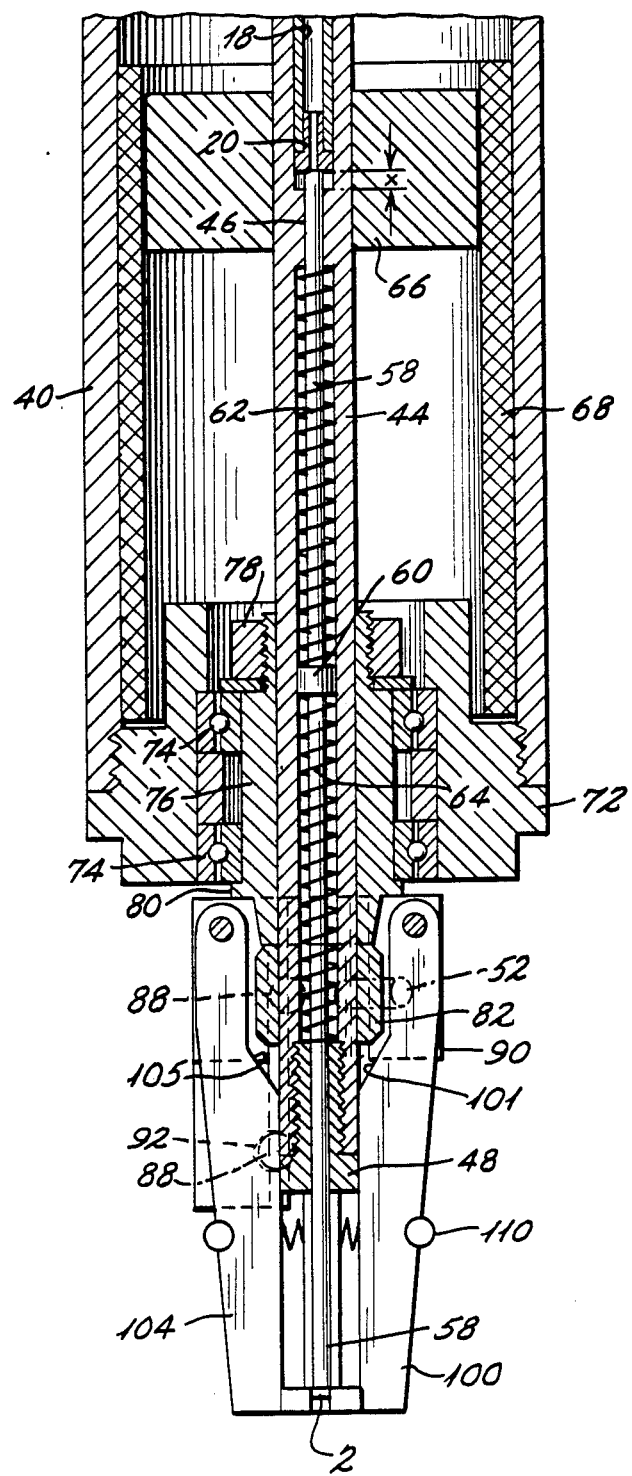

Referring to the drawings, upper and lower drive tube sections 22 and 44 are connected by a coupling 42 such that the drive tubes 22 and 44 are displaceable linearly as a unit while portion 44 is rotatable relative to portion 22 about the longitudinal axis thereof. The drive tubes 22, 44 are telescopic over vacuum tube 18 attached to a vacuum fitting 16 which, in turn, is attached to an end closure 14 of cylindrical casing portion 10. A pluglike member 24 is attached to linear drive tube 22 and, in turn, supports cylinder 26 about which coil 28 is wound. A stack of cylindrical permanent magnets 30 is appropriately positioned so that a linear "voice coil" type of electric motor is provided whereby the drive tubes 22 and 44 are linearly displaced along the longitudinal axis of the spindle unit according to energization of the linear motor. The limits of displacement provided by the linear motor are sensed by Hall effect switches 34 and 36. A sensor 12, in combination with markings on the outside diameter of the coil 28, provides a linear encoder for control of such energization and consequent linear displacement.

The permanent magnet 30 is appropriately attached to a threaded fitting 32 which threadedly connects the linear motor casing 10 and rotary motor casing 40 while also providing a groove on the outside diameter thereof for attachment to a mounting yoke.

The rotary motor portion of the spindle comprises a coil 68 affixed to the internal diameter of rotary motor casing porton 40 and a rotor 66 fixed to rotary drive tube 44 so as to rotate drive tube 44 upon energization of coil 68.

A rotary encoder comprises sensors 56 fixed in casing 40 and discs 54 attached to rotary drive tube 44 and having encoding lines on the outer periphery thereof in order to sense both directions of rotation of drive tube 44. A movable vacuum tube 58 is telescopic within reduced internal diameter portion 46 of drive tube 44 and plug 48, and has component protection spring 62 and vacuum tube retract spring 64 bearing against opposite sides of an enlarged portion 60 on the outer diameter of vacuum tube 58. Thus, in the positions of FIGS. 4A, 4B, 5A, and 5B, movable vacuum tube 58 is urged into engagement with fixed vacuum tube 18 under the influence of spring 64 and, in the fully extended position illustrated in FIG. 5C, spring 62 prevents damage to the component being "picked" or "placed" by yieldably urging vacuum tube 58 to the extended position.

Figure 6:
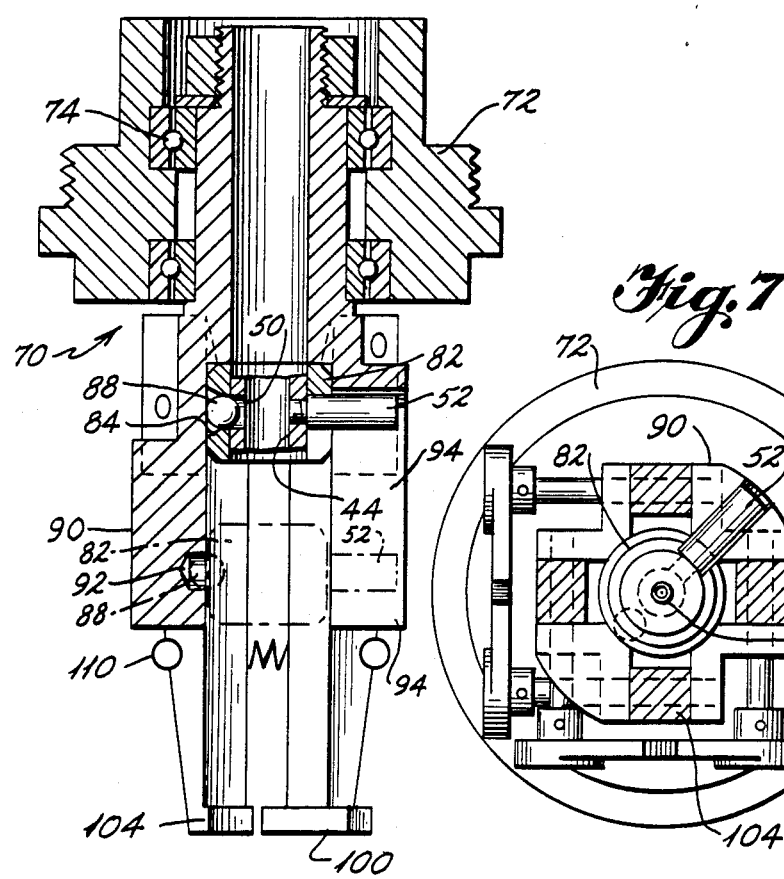
FIG. 6 is a cross-section of a tool assembly separate from the overall spindle assembly, but with a small portion of the drive tube illustrated to show the threaded connection of rod 52 thereto.
Figure 7:
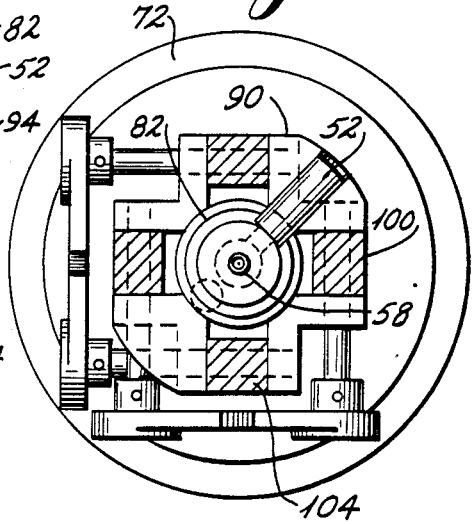
FIG. 7 is a cross-section as generally viewed in the direction of arrows 7—7 of FIG. 1.

The tool assembly 70, one version of which is illustrated in FIG. 6, is easily removable as a unit from the spindle assembly to provide for interchangeability with similar tool assemblies according to the size of the component being handled and the function to be provided by the tool assembly. The tool assembly comprises a plug 72 threaded into the end of the rotary motor casing 40. Shank 76 of support bracket 90 is rotatably supported within plug 72 by bearings 74. Bracket 90 pivotally supports two sets of cooperating fingers 100, 104.

Figure 8:
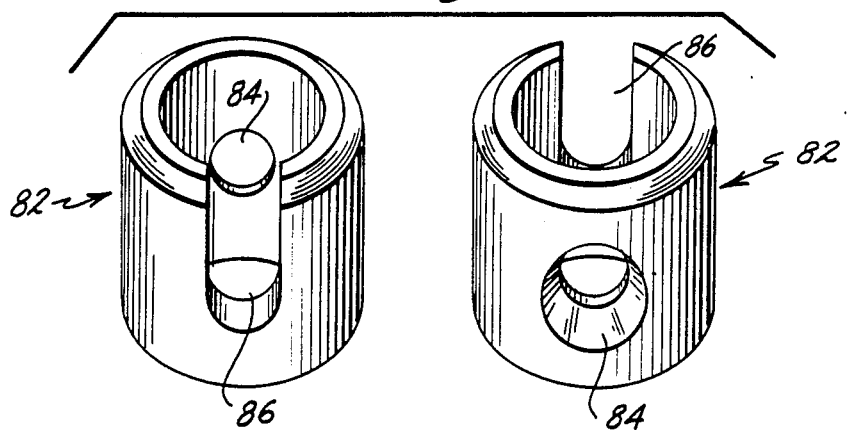
FIG. 8 is an isometric front and rear view of the cam of the tool assembly.

Fingers 100 and 104 are urged to the closed position by spring 110. Cam 82 carries ball 88 which is shiftable between a detent 92 in support bracket 90 and a detent 50 in a drive tube 44 according to the position of drive tube 44 along the longitudinal axis of the spindle. Additionally, cam 82 opens each set of fingers, in turn, by engaging respective surfaces 101 and 105 during extension of drive tube 44. A rod 52 is threadedly received in drive tube 44 and is slideable within a slot 94 (FIG. 9) of support bracket 90 as well as a slot 86 (FIG. 8) of cam 82. Thus, engagement of rod 52 in slot 94 of support bracket 90 imparts rotary motion of bracket 90 about the longitudinal axis of the spindle during rotation of drive tube 44, and engagement of rod 52 in groove 86 of cam 82 will pick-up cam 82 during retraction of drive tube 44 and thus allow closing of fingers 100, 104 by spring 110.

GENERAL OPERATION OF THE DEVICE

Figure 5A:
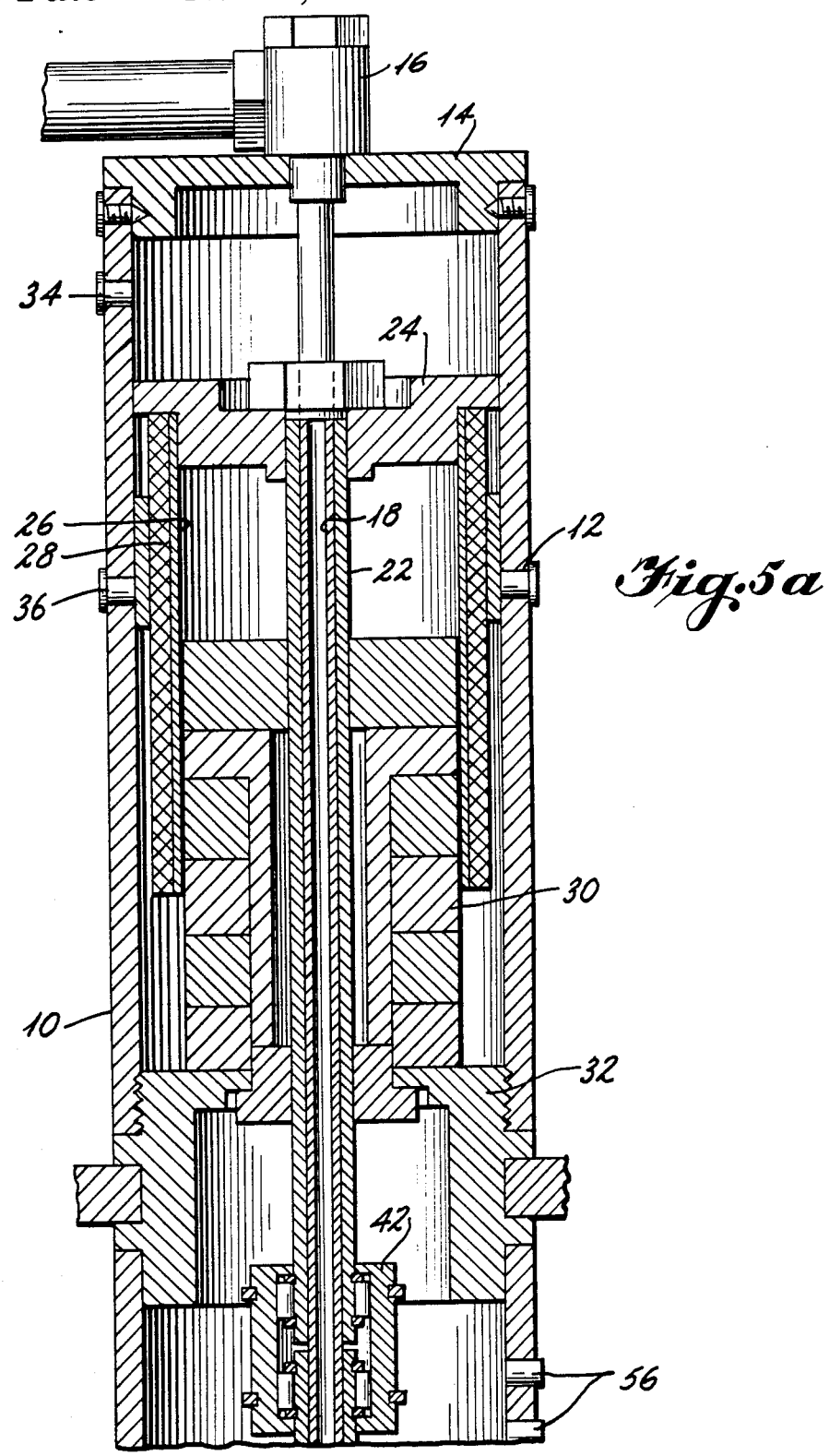

Prior to "picking" a component, the spindle assembly is in the position generally illustrated in FIGS. 4A and 4B, wherein the drive tube is fully retracted, the vacuum tube is not holding a component, and the fingers are closed. One or more of the spindle units is typically mounted upon a robotic arm such as that disclosed in U.S. Pat. No. 4,151,945—Ragard, et al., issued on May 1, 1979. With such a mounting, the spindle assembly is transferable to acquire a component from a "pick" station for subsequent insertion at a "place" station.

PICKING

With the longitudinal axis of the spindle generally centered on a component, the linear motor is actuated to extend the drive tubes 22 and 44. Upon partial extension (FIGS. 5A, 5B) of the linear and rotary drive tubes 22, 44 (i.e., 0.300 in. of linear displacement) fingers 100 and 104 are opened sequentially by cam 82, and then cam 82 is detached from driving engagement with tube 44 by outward displacement of ball 88 into detent 92.

Upon full extension of the drive tube to the position of FIG. 5C (i.e., an additional 0.800 in. of linear displacement) vacuum tube 58 engages and holds a component 2 to the tip thereof by vacuum. Spring loading of vacuum tube 58 within drive tube 44 by spring 62 allows yieldable engagement of tube 58 with the component 2, thus protecting the component and tip from damaging forces.

Next, during partial retraction (FIGS. 5A, 5B) of the drive tube and vacuum tube, rod 52 engages slot 94 of finger support bracket 90 and slot 86 of cam 82. Thus, upon further full retraction of the drive tube, cam 82 moves with the drive tube 44 via engagement of ball 88 in detent 50 and spring 110 closes fingers 100, 104 sequentially under the control of surfaces 101, 105 in engagement with cam 82 during retraction. As may be appreciated from the drawings, cam 82 clears surface 105 prior to clearing surface 101 such that one set of fingers closes before the other set in order to provide for squaring and centering of the component upon the longitudinal axis of the spindle assembly.

TRANSFERRING

With rod 52 in slot 94 of the finger support bracket 90, the fingers of the tool assembly may be rotated about the longitudinal axis of the spindle, upon rotation of rotary drive tube 44 by the rotary motor, during transfer of the component from the "pick" station to the "place" station.

PLACING

Having aligned the longitudinal axis of the spindle assembly with a particular location on a circuit board or the like to which the component is to be placed, the linear motor is actuated to partially extend the drive tubes 22, 44 with the cam 82 connected thereto for opening of jaws 100, 104. Cam 82 then is disengaged from drive tube 44 by displacing ball 88 from detent 50 of drive tube 44 into detent 92 of finger support bracket 90. Further, full extension of the drive tube to the position illustrated in FIG. 5C extends the vacuum tube for placement of the component at the selected location on a substrate or the like, with spring 62 again protecting the component and vacuum tube tip, as well as the substrate, during such placement. Typically, "air kiss", positive air pressure, may be utilized at this time to provide positive disengagement of component 2 from the tip of vacuum tube 58.

Thereafter, the spindle assembly is transferred to the same or a different supply in order to "pick" another component. During such transfer, the drive tubes of the spindle assembly may be retracted either fully or partially according to time and clearance parameters of the job being performed.

In the embodiment illustrated, rod 52 must be unthreaded from drive tube 44 in order to remove tool assembly 70 as a unit. However, it is considered well within the context of the invention to provide some other structure for linking the rotary drive between finger support bracket 90 and drive tube 44 without the need for such removal from the drive tube or the like.

In a prototype of the illustrated embodiment, the overall spindle unit with a tool assembly was 9 inches long in the retracted position and 9.8 inches long in the fully extended position, and the casing without the tool assembly was 7.3 inches long with an outside diameter of 1.5 inches.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense. It is also to be understood that the following claims are intended to cover all of the generic and specific features of the invention herein described and all statements of the scope of the invention which, as a matter of language, might be said to fall therebetween.

I claim:

1. In a head assembly for pick and place of components, and comprising a component pick-up device reciprocatable along a longitudinal axis and means for imparting reciprocation to said pick-up device, the improvement comprising:
a casing;
said reciprocation imparting means comprising a direct drive linear motor enclosed within said casing;
means, connected to said casing and operatively associated with said pick-up device, for squaring said component relative to an orthogonal coordinate system having one axis generally parallel to said longitudinal axis; and means, operatively associated with said pick-up device, for orienting said component about said longitudinal axis, said orienting means comprising a direct drive rotary motor enclosed within said casing and operatively associated with a tool assembly having component engaging fingers.

2. The improvement of claim 1, wherein said linear motor comprises:
a brushless electric motor.

3. The improvement of claim 1, and further comprising:
means, connected to said casing and operatively associated with said pick-up device, for centering a component generally upon said longitudinal axis.

4. The improvement as in claim 1, wherein said rotary motor comprises:
a brushless electric motor.

5. The improvement as in claim 1, and further comprising:
means for sensing rotation imparted by said rotary motor in order to control said orienting in response thereto.

6. The improvement as in claim 1, and further comprising:
means for sensing displacement imparted by said linear motor in order to control linear displacement of said pick-up device in response thereto.

7. The improvement of claim 1, and further comprising:
a tool assembly, operatively associated with said pick-up device and connected to said casing, said tool assembly comprising fingers engageable with and disengageable from said component in response to operation of said linear motor in order to accomplish said squaring.

8. The improvement as in claim 7, and further comprising:
means for removably connecting said tool assembly as a unit to said casing;
whereby similarly connectable tool units are interchangeably attachable to said casing so as to provide for changing of component handling constraints such as size and function.

9. In a head assembly for pick and place of components, and comprising a component pick-up device reciprocatable along a longitudinal axis and means for imparting reciprocation to said pick-up device, the improvement comprising:
a casing;
said reciprocation imparting means comprising a direct drive linear motor enclosed within said casing;
means, connected to said casing and operatively associated with said pick-up device, for squaring said component relative to an orthogonal coordinate system having one axis generally parallel to said longitudinal axis;

a tool assembly, operatively associated with said pick-up device and connected to said casing, said tool assembly comprising fingers engageable with and disengageable from said component in response to operation of said linear motor in order to accomplish said squaring; and means for removeably connecting said tool assembly as a unit to said casing;
whereby similarly connectable tool units are interchangeably attachable to said casing so as to provide for changing of component handling constraints such as size and function.

10. The improvement as in claim 9, and said tool assembly further comprising:
means for centering said component generally upon said longitudinal axis.

11. In a pick and place head assembly for handling electrical components, said head assembly comprising a vacuum tube reciprocatable along a longitudinal axis in order to accomplish pick-up and placement of a component, the improvement comprising:
an electric linear displacement motor and an electric rotary displacement motor enclosed within a casing as a unit and operatively associated as a unitary head with a tool assembly connected to said casing, in order to impart linear and rotational displacement to said component according to a controller.

12. The improvement of claim 11, and further comprising:
a divided drive tube coupled so that a rotary portion is rotational relative to a linear portion about a common longitudinal axis, said linear and rotary portions linearly displaceable as a unit along said longitudinal axis by said linear displacement motor, and said rotary portion rotatable about said longitudinal axis by said rotary displacement motor.

13. The improvement of claim 12, wherein:
said tool assembly is operatively connected to said drive tube and comprises fingers engageable with and disengageable from said component according to linear displacement of said drive tube.

14. The improvement of claim 13, wherein:
said tool assembly is operatively connectable to and disconnectable from said drive tube in order to provide rotation of said fingers about said longitudinal axis as a unit.

15. The improvement as in claim 11, and further comprising:
means for removeably connecting said tool assembly, as a unit, to said casing;
whereby similarly connectable tool units are interchangeably attachable to said casing so as to provide for changing component handling constraints such as size and function.

* * * * *